(12) United States Patent
Timberlake et al.

(10) Patent No.: US 9,994,696 B2
(45) Date of Patent: Jun. 12, 2018

(54) FLAME RETARDANT RESINS COMPRISING PHOSPHOROUS CONTAINING FLAME RETARDANTS

(71) Applicant: Chemtura Corporation, Middlebury, CT (US)

(72) Inventors: Larry D. Timberlake, Kirkwood, MO (US); Mark V. Hanson, Omaha, NE (US)

(73) Assignee: LANXESS Solutions US Inc., Middlebury, CT (US)

( * ) Notice: Subject to any disclaimer, the term of this patent is extended or adjusted under 35 U.S.C. 154(b) by 0 days. days.

(21) Appl. No.: 15/358,377

(22) Filed: Nov. 22, 2016

(65) Prior Publication Data

US 2017/0073503 A1    Mar. 16, 2017

Related U.S. Application Data

(62) Division of application No. 14/717,348, filed on May 20, 2015, now Pat. No. 9,534,108.

(60) Provisional application No. 62/132,554, filed on Mar. 13, 2015.

(51) Int. Cl.
| | |
|---|---|
| *C08K 3/32* | (2006.01) |
| *C08K 5/5317* | (2006.01) |
| *C08L 63/00* | (2006.01) |
| *C08J 5/24* | (2006.01) |
| *B32B 27/06* | (2006.01) |
| *B32B 27/38* | (2006.01) |
| *C08J 5/12* | (2006.01) |
| *C08J 5/10* | (2006.01) |
| *B32B 5/10* | (2006.01) |
| *H05K 1/03* | (2006.01) |
| *H05K 3/46* | (2006.01) |
| *C08K 5/00* | (2006.01) |

(52) U.S. Cl.
CPC .............. *C08K 5/5317* (2013.01); *B32B 5/10* (2013.01); *B32B 27/06* (2013.01); *B32B 27/38* (2013.01); *C08J 5/10* (2013.01); *C08J 5/124* (2013.01); *C08J 5/24* (2013.01); *C08L 63/00* (2013.01); *H05K 1/0373* (2013.01); *H05K 3/4626* (2013.01); *B32B 2262/101* (2013.01); *B32B 2307/3065* (2013.01); *B32B 2363/00* (2013.01); *B32B 2457/00* (2013.01); *B32B 2457/08* (2013.01); *C08J 2363/00* (2013.01); *C08J 2463/00* (2013.01); *C08K 5/0066* (2013.01); *C08L 2201/02* (2013.01); *C08L 2203/20* (2013.01); *H05K 2201/012* (2013.01); *H05K 2203/1147* (2013.01)

(58) Field of Classification Search
CPC ....... C08K 5/5313; C08K 5/5317; C08K 3/32
See application file for complete search history.

(56) References Cited

U.S. PATENT DOCUMENTS

| | | | |
|---|---|---|---|
| 3,894,986 A | 7/1975 | Werner et al. | |
| 4,972,011 A | 11/1990 | Richardson et al. | |
| 5,053,148 A * | 10/1991 | von Bonin | C04B 38/00 |
| | | | 106/122 |
| 5,780,534 A | 7/1998 | Kleiner et al. | |
| 6,255,371 B1 | 7/2001 | Schlosser et al. | |
| 6,365,071 B1 | 4/2002 | Jenewein | |
| 6,403,220 B1 | 6/2002 | Brennan et al. | |
| 6,547,992 B1 | 4/2003 | Schlosser et al. | |
| 6,645,631 B2 | 11/2003 | Gan et al. | |
| 7,531,585 B2 | 5/2009 | Ozawa et al. | |
| 8,445,718 B2 | 5/2013 | Suwa et al. | |
| 2006/0138391 A1 | 6/2006 | Drewes et al. | |
| 2007/0029532 A1 | 2/2007 | Hansel et al. | |
| 2011/0177330 A1 | 7/2011 | Tanaka et al. | |
| 2012/0296013 A1 | 11/2012 | Timberlake et al. | |
| 2013/0025916 A1 | 1/2013 | Levchik et al. | |
| 2015/0031805 A1 | 1/2015 | Stockdale et al. | |
| 2015/0141556 A1 | 5/2015 | Stockdale et al. | |

FOREIGN PATENT DOCUMENTS

| | | |
|---|---|---|
| DE | 3833977 A1 | 4/1990 |
| WO | 2005097894 A1 | 10/2005 |
| WO | 2010131678 A1 | 11/2010 |
| WO | 2012045414 A1 | 4/2012 |

OTHER PUBLICATIONS

Pham et al.: "Epoxy Resins", Jan. 1, 2004, Encyclopedia of Polymer Science and Technology, pp. 1-127.
PCT International Search Report and Written Opinion dated Oct. 20, 2015 from corresponding Application No. PCT/US2015/032269, 11 pages.
Japanese Office Action dated Jun. 23, 2016 from corresponding JP Application No. 2015-539971, along with unofficial English translation, 10 pages.

* cited by examiner

*Primary Examiner* — Arrie L Reuther
(74) *Attorney, Agent, or Firm* — Dilworth IP LLC

(57) ABSTRACT

Resin compositions comprising flame retardant materials obtained by heating phosphonic acid salts at temperatures above 200° C., have excellent properties and exhibit manageable curing behavior. Laminates, composites, molded articles and the like, which have excellent flame retardant properties and physical characteristics, are readily prepared from the resin compositions of the invention.

20 Claims, No Drawings

FLAME RETARDANT RESINS COMPRISING PHOSPHOROUS CONTAINING FLAME RETARDANTS

Resin compositions comprising flame retardant materials obtained by heating phosphonic acid salts at temperatures above 200° C. exhibit good curing behavior to produce materials, including laminates, composites, molded articles and the like, which have excellent flame retardant properties and physical characteristics.

BACKGROUND

Epoxy resins have long been used in various industrial applications, many of which must meet demanding performance criteria. For example, epoxy compositions are often used in the formation of composite materials and laminates, such as in the production of electrical laminates used in printed circuit boards (printed wiring boards, PWB). A requirement of this application, and many other applications, is highly flame resistance materials are required, and often a fire retardancy level of V-0 in the standard Underwriters Laboratory test method UL 94 is mandated.

Many types of flame retardant substances are known and many have been used in such applications, but the most commonly used materials to date have been halogen containing compounds, such as tetrabromobisphenol A. Typically, in order to reach the desired fire retardancy level (V-0 in the standard "Underwriters Laboratory" test method UL 94), levels of such bromine-containing flame retardant substances are required that provide a bromine content from 10 weight percent to 25 weight percent based on the total weight in the product.

There is an increasing interest in non-halogen containing flame-retardants that can not only provide the necessary flame retardancy, but which do so without having a negative impact on processing or physical characteristics such as mechanical properties, toughness, solvent and moisture resistance, etc. In certain applications the cure rate of an epoxy resin is an important consideration, e.g., a short cure time has obvious advantages in any manufacturing process but in some instances an epoxy composition may cure too quickly to allow for robust or exacting processing conditions. A flame retardant material that does not negatively impact on any of these important criteria is desirable; a flame retardant material that can enhance a desirable characteristic is highly desirable.

Phosphorus based flame retardants have been used as alternatives to halogenated flame retardants. Alkyl and aryl substituted phosphonic acid esters are compatible with epoxy resins but they are known plasticizers that can lower glass transition temperatures of some cured epoxy composition to unsatisfactory levels. They can also cause the resulting cured epoxy resin to absorb moisture, which can be very detrimental in many applications such as electrical laminates. Other phosphorus based flame retardant materials are known, for example, EP 0 754 728 discloses a cyclic phosphonate, EP 1 116 774 discloses the use of a hydrogen phosphinate, 9,10-dihydro-9-oxa-10-phosphaphenanthrene-10-oxide, in conjunction with triphenylphosphine oxide, but their use in some epoxy applications is often limited by process or performance difficulties or by increasing the costs of manufacture.

Phosphine oxide flame retardants have been used in epoxy resins. Phosphine oxide compounds containing reactive groups are known which are capable of being bound to a polymer, either into the backbone or attached to a pendant chain. For example, U.S. Pat. Nos. 5,817,736; 5,759,690; 5,756,638, 5,648,171; 5,587,243; 5,576,357; 5,458,978; 5,376,453; and 5,036,135 disclose the incorporation of a phosphorus based flame retardant compound into an epoxy resin, which is then cured with an amino cross-linker such as dicyandiamide, sulfanilamide, and the like.

U.S. Pat. Nos. 6,733,698; 6,740,732; 8,404,161; and 8,865,862 disclose hydroxyarylphosphine oxide flame retardants which can react with epoxy groups and serve as cross linkers for epoxy resins. Alternately, these compounds can be derivatized prior to incorporation into epoxy resins, for example, reaction between the phenoxy group and epichlorohydrin provides a useful epoxy functionalized material.

U.S. Pat. Nos. 6,403,220 and 6,645,631 disclose a general process for the preparation of electrical laminates useful in printed circuit boards, which process comprises (1) applying or impregnating an epoxy-containing formulation onto or into a substrate, such as a woven or nonwoven fiber mat containing, e.g., glass fibers or paper, which substrate is then (2) heated at a temperature sufficient to draw off solvent from the epoxy formulation and optionally to partially cure the epoxy formulation. This heating step is known as "B-staging" and the product is known as a "prepreg", which, as a result of "B-staging", is more easily handled in the subsequent manufacturing steps wherein (3) one or more sheets of prepreg are stacked or laid up in alternating layers with one or more sheets of a conductive material such as copper foil, if an electrical laminate is desired, and pressed at elevated temperature and pressure for a time sufficient to cure the resin and form a laminate. Common temperatures for the "B-staging" step are from about 900° C. to about 210° C. for a time ranging from about 1 minute to about 15 minutes, but other temperatures and times can be used.

The formation of laminates can be a very exacting process. One difficulty encountered in preparing laminates such as those found in circuit boards, is that some curable epoxy compositions have gel times, i.e., the time period during which a prepreg remains partially cured and easily handled, of less than 180 seconds, sometimes much less, as observed by the stroke cure test, which complicates production of prepregs and the final laminates. Gel times of greater than 250 seconds, for example 300 seconds or greater are much more desirable. Some epoxy resin formulations cure at an unacceptably fast rate to allow for proper handling. Copending U.S. patent application Ser. No. 13/455,414 discloses that certain phosphorus containing salts that are also known as flame retardants, e.g., salts of phosphinic acids, can retard the cure rate of epoxy compositions when used at very low levels, e.g., less than 2 wt %. Of course one does not want overly extend the curing time for commercial and quality reasons.

Other flame retardants derived from phosphorus containing acids and salts are known. For example, copending U.S. patent application Ser. Nos. 14/337,500 and 14/592,472, disclose that products obtained by heating certain alkylphosphonic acid metal salts, such as aluminum salts, calcium salts, zinc salts etc., at temperatures in excess of 200° C. are thermally stable at temperatures above 400° C. and are readily incorporated onto polymer compositions to provide excellent flame retardant properties. It has been found that these highly stable and compatible flame retardants can be added to many epoxy compositions at levels up to 50% and often higher, e.g., 55% or 60% by weight in a straightforward manner without interfering with processing, without volatizing or exuding from the cured or precured composition, without negatively impacting desired physical properties, while having a negligible effect on cure rates. Higher concentrations of the flame retardant in certain resins are possible depending on the resin formulation, the processing or application methods and the physical properties of the pre-cured and cured resin. These compositions are typically halogen free and are well suited for use in preparing, highly flame retardant laminates, composites and the like, including e.g., circuit boards and prepregs for circuit boards.

SUMMARY OF THE INVENTION

Flame retardant resin compositions, useful, for example, in laminates, composites and the like, and articles prepared from said composition are provided. One embodiment relates to a composition comprising:
a) an epoxy resin, and
b) a phosphorus containing flame retardant material obtained by heating at temperatures of 200° C. or higher, e.g., 220° C. or higher, generally at temperatures of 250° C. or higher, e.g. from about 250° C. to about 400° C. or from about 260° C. to about 360° C., one, or more than one, phosphonic acid salt, i.e., compounds of formula (I)

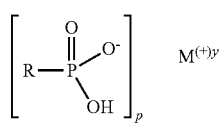

wherein R is an alkyl, aryl, alkylaryl or arylalkyl group, p is a number of from 1 to 7, e.g., from 1 to 4, e.g., 1, 2, 3 or 4, M is a metal, y is a number of from 1 to 7, e.g., from 1 to 4, e.g., 1, 2, 3 or 4, often 2 or 3, so that $M^{(+)y}$ is a metal cation where (+)y represents the charge formally assigned to the cation.

Further embodiments of the invention provide a curable composition, e.g., a halogen free composition, comprising a) an epoxy resin, b) the flame retardant above, and c) a cross-linker; the curable composition further comprising d) one or more additional flame retardants, flame retardant synergists and/or flame retardant adjuvants; the cured epoxy compositions produced therefrom, and articles comprising the compositions, such as molded articles, laminates, composites and the like, for example, prepregs useful in the construction of printed circuit boards and the circuit boards comprising said prepregs.

DESCRIPTION OF THE INVENTION

Materials useful as the flame retardant b) in the present composition can be found, e.g., in copending U.S. patent application Ser. Nos. 14/337,500 and 14/592,472, and methods for preparing the material can be found therein. In general, the flame retardant material of b) is obtained by heating at temperatures of 200° C. or higher, e.g., 220° C., often 250° C. or higher, one, or more than one, phosphonic acid salt, i.e., compounds of formula (I)

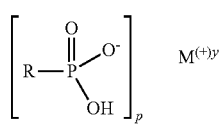

wherein R is an alkyl, aryl, alkylaryl or arylalkyl group, p is a number of from 1 to 7, e.g., from 1 to 4, e.g., 1, 2, 3 or 4, M is a metal, y is a number of from 1 to 7, e.g., from 1 to 4, e.g., 1, 2, 3 or 4, often 2 or 3, so that $M^{(+)y}$ is a metal cation where (+)y represents the charge formally assigned to the cation.

In formula (I), $M^{(+)y}$ where y is 1 represents a mono-cation such as $Li^+$, $Na^+$ or $K^+$, $M^{(+)y}$ where y is 2 represents a di-cation such as $Mg^{++}$, $Ca^{++}$ or $Zn^{++}$ and the like, $M^{(+)y}$ where y is 3 represents a tri-cation such as $Al^{++}$, etc. As is common with organometallic species, the formulae are idealized and the starting materials may include complex salts or salts where certain atomic valences are shared such as where a single oxygen anion is shared between two metal cations, etc. Typically, the starting salt is charged balanced, that is, a compound of formula (I) wherein p=y, e.g., when $M^{(+)y}$ is $Na^+$, p is 1, when M is $Al^{+++}$ p is 3, etc.

The flame retardants above are obtained by thermal conversion of the phosphonic acid salts of formula I before incorporation into the substrate being rendered flame retardant. As shown, for example, in U.S. patent application Ser. No. 14/337,500, salts of formula (I) are not themselves stable at high temperatures and attempts to incorporate the compounds of formula (I) directly into polymers at elevated temperatures can cause damage such as polymer degradation and a loss of physical properties.

Not wanting to be bound by theory, analytical data suggest that the material generated by heating compounds of formula (I) at the listed temperature comprises a compound or a mixture of compounds one or more of which is believed to be generically represented by the empirical formula (IV):

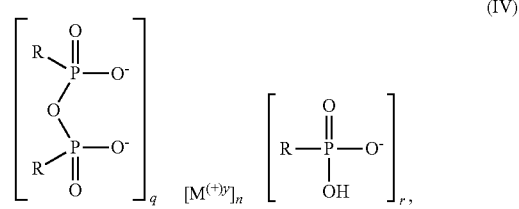

wherein R and M are as defined for formula (I), q is a number of from 1 to 7, e.g., 1, 2 or 3, r is a number from 0 to 5, e.g., 0, 1 or 2, often 0 or 1, y is a number of from 1 to 7, e.g., from 1 to 4, e.g., 1, 2, 3, or 4, and n is 1 or 2, provided that 2(q)+r=n(y). It is believed that more than one compound is typically present in the material so generated.

The phosphonic acid salts of formula (I) are known and various methods for their preparation are described in the art. For example, US 2006/0138391 discloses compounds of formula (I) wherein R is hydrogen, $C_{1-18}$ alkyl, $C_{5-6}$ cycloalkyl, $C_{2-6}$ alkenyl, $C_{6-10}$ aryl, or $C_{7-10}$ aralkyl, which alkyl, alkenyl, aryl, or aralkyl can be unsubstituted or substituted by halogen, hydroxyl, amino, $C_{1-4}$ alkylamino, di-$C_{104}$ alkylamino, $C_{1-4}$ alkoxy, carboxy or $C_{2-5}$ alkoxycarbonyl; and M can be selected from, e.g., Group IA, IB, IIA, IIB, IIIA, IVA, VA or VII of the Periodic Table, for example Li, K, Na, Mg, Ca, Ba, Zn, Ge, B, Al, Cu, Fe, Sn or Sb, etc. It is noted that in US 2006/0138391 none of the compounds corresponding to the formula (I) above were heated above 200° C. or compounded into a polymer resin at elevated temperature.

In some embodiments of the invention, the salts of formula (I) comprise compounds wherein R is $C_{1-12}$ alkyl, $C_{6-10}$ aryl, $C_{7-18}$ alkylaryl, or $C_{7-18}$ arylalkyl group, wherein said groups are further substituted as described in US 2006/0138391, but often R is unsubstituted $C_{1-12}$ alkyl, $C_{6-10}$ aryl, $C_{7-18}$ alkylaryl, or $C_{7-18}$ arylalkyl. For example, R is substituted or unsubstituted, typically unsubstituted, $C_{1-6}$ alkyl, $C_6$ aryl, $C_{7-10}$ alkylaryl, or $C_{7-12}$ arylalkyl, e.g., $C_{1-4}$ alkyl, $C_6$ aryl, $C_{7-19}$ alkylaryl, or $C_{7-10}$ arylalkyl.

While in the most general embodiments of the invention $M^{(+)y}$ may be almost any metal cation, M is generally selected from Li, K, Na, Mg, Ca, Ba, Zn, Zr, Ge, B, Al, Si, Ti, Cu, Fe, Sn or Sb, for example, e.g., Li, K, Na, Mg, Ca, Ba, Zn, Zr, B, Al, Si, Ti, Sn or Sb, in many embodiments M is Li, K, Na, Mg, Ca, Ba, Zn, Zr, B, Al, Sn or Sb, and in certain embodiments M is Al, Zn or Ca. For example, excellent results are achieved when M is Al or Ca.

R as alkyl is a straight or branched chain alkyl group having the specified number of carbons and includes e.g., unbranched alky such as methyl, ethyl, propyl, butyl, pentyl, hexyl heptyl, octyl, nonyl, decyl, undecyl, dodecyl, and unbranched alkyl such as iso propyl, iso-butyl, sec-butyl, t-butyl, ethyl hexyl, t-octyl and the like. For example, R as alkyl is methyl, ethyl, propyl, iso propyl, butyl, iso butyl, sec-buty, t-butyl, often R is methyl, ethyl, propyl or isopropyl, for example methyl.

Typically, when R is aryl it is phenyl or naphthyl, for example, phenyl. Examples of R as alkylaryl include phenyl substituted by one or more alkyl groups, for example groups selected from methyl, ethyl, propyl, isopropyl, butyl, iso butyl, sec-buty, t-butyl, and the like. Examples of R as arylalkyl, include for example, benzyl, phenethyl, styryl, cumyl, phenpropyl and the like.

In one embodiment R is methyl, ethyl, propyl, isopropyl, phenyl or benzyl, e.g., methyl or phenyl.

In certain embodiments, for example, the starting material is one or more compounds of formula (I) wherein R is methyl, ethyl, propyl, isopropyl, benzyl or phenyl, M is Al, Zn or Ca, and p is 2 or 3. In one particular embodiment R is methyl, ethyl, propyl, isopropyl, or phenyl, p=3 and M is Al; in another particular embodiment R is methyl, ethyl, propyl, isopropyl, or phenyl, p=2 and M is Zn or Ca, e.g., Ca.

Typically, thermal treatment of a compound of formula (I) as above generates a material comprising more than one compound, at least one of which is believed to be generically represented by the empirical formula (IV) and complex dehydration products thereof. As is common with organometallic species, the formula (IV) is idealized and the product may include polymeric salts, complex salts, salts where certain atomic valences are shared, etc.

For example, when M is aluminum, i.e., when a compound of formula (I) wherein M is Al is heated according to the invention, elemental analysis suggests the formation of a product having an empirical formula (IV) wherein q is 1, r is 1, n is 1 and y is 3.

When formed from a compound of formula (I) wherein one R group and one metal is present, a mixture of compounds typically forms comprising at least one compound of formula (IV), wherein said mixture and said compound or compounds of formula (IV) comprise the one R group and the one metal. In some embodiments of the invention, the flame retardant material comprises a mixtures of compounds wherein more than one R group and/or more than one metal is present, and wherein a mixture of compounds of formula (IV) comprising more than one R group and/or more than one metal is present. Flame retardants of the invention comprising compounds containing more than one R groups and/or more than one metal can be formed in various ways.

In a first method, which can be called the intermediate salt complex method, one or more phosphonic acid compounds are treated with one or more appropriate metal compounds to give an intermediate salt complex corresponding to formula (I), which complex comprises multiple values for R and/or M. Often the metal, or at least one of the metals used in forming the intermediate salt complex will be a bidentate or polydentate metal and more than one intermediate complex may be formed. This salt complex is then heat-treated as described above to obtain a flame retardant material comprising:

a) at least one compound corresponding to formula (IV) having more than one than one R group and/or more than one M group, and/or b) a mixture of compounds corresponding to formula (IV) are present said mixture comprising compounds with different R groups and/or different M groups.

Alternatively, in a second method, which can be called the intimate salt mixture method, two or more metal phosphonic acid salts of formula (I) are brought together to form an intimate salt mixture comprising salts which have differing values for R and/or M. This mixture is then subjected to heat treatment described above to obtain a flame retardant material comprising:

a) at least one compound corresponding to formula (IV) having more than one than one R group and/or more than one M group, and/or b) a mixture of compounds corresponding to formula (IV) are present said mixture comprising compounds with different R groups and/or different M groups.

A third method for obtaining flame retardant materials of the invention comprising compounds of formula (IV) having multiple values for R and/or M comprises separately heating two or more individual metal phosphonic acid salts of formula (I), which differ by having different values for R and/or M, as described above to separately obtain two or more flame retardant materials of the invention, which are subsequently mixed together to form a blended flame retardant composition.

The exact composition the mixtures obtained by the preceding three processes, i.e., the intermediate salt complex method, the intimate salt mixture method, and the blending of separately obtained flame retardant materials, will generally be different even when starting from the same phosphonic acid compounds and metals. Thus, differences in physical characteristics, stability, miscibility and performance for the products of the different methods are generally encountered.

In many embodiments of the invention, the epoxy resin composition will comprise flame retardants in addition to those of component b) as described above, as well as synergists, adjuvants and other common additives.

In the broadest embodiments on the invention any suitable epoxy resin may be used in component a), e.g., the epoxy resin material may be any saturated or unsaturated aliphatic, cycloaliphatic, aromatic or heterocyclic compound which possesses more than one 1,2-epoxy group. Many examples of which are described in Epoxy Resins Chemistry and Technology, Second Edition edited by Clayton A. May (Marcel Dekker, Inc. New York, 1988), Chemistry and Technology of Epoxy Resins edited by B. Ellis (Blackie Academic & Professional, Glasgow, 1993), Handbook of Epoxy Resins by H. E. Lee and K. Neville (McGraw Hill, New York, 1967), and EP 1116774 A2. More than one epoxy resin may be present.

Suitable epoxy resins include, but are not limited to, epoxy resins based on bisphenols and polyphenols, such as, bisphenol A, tetramethylbisphenol A, bisphenol F, bisphenol S, tetrakisphenylolethane, resorcinol, 4,4'-biphenyl, dihydroxynaphthylene, and epoxy resins derived from novolacs, such as, phenol:formaldehyde novolac, cresol:formaldehyde novolac, bisphenol A novolac, biphenyl-, toluene-, xylene-, or mesitylene-modified phenol:formaldehyde novolac, aminotriazine novolac resins and heterocyclic epoxy resins derived from p-amino phenol and cyanuric acid. Additionally, aliphatic epoxy resins derived from 1,4-butanediol, glycerol, and dicyclopentadiene skeletons, are suitable. Examples of heterocyclic epoxy compounds are diglycidylhydantoin or triglycidyl isocyanurate. Many other suitable epoxy resin systems are available and would also be recognized as being suitable by one skilled in the art. For example, epoxy resins comprising a phosphorus moiety are known and may be used in some embodiments of the invention. Epoxy compounds comprising phosphorus containing moieties include, for example, alkyl, alkenyl, aromatic and benzylic diglycidyl phosphonates, phosphates and thiophosphates, triglycidyl and tris-alkylglycidyl phosphates, DOPO-based epoxy resins, etc., many of which can be found U.S. Pat. No. 5,376,453.

In some embodiments an epoxy resin comprising a phosphorus flame retardant moiety may be present. In such a case, a lower concentration of the flame retardant material described above for component b) may be needed to achieve the desired flame retardancy.

For example, U.S. Pat. Nos. 6,403,220 and 6,645,631 disclose useful phosphorus containing epoxy resins, many of which comprises phosphorus flame retardant moieties, obtained by reacting an epoxy resin, such as an epoxy novolac, a dicyclopentadiene phenol epoxy novolac; a glycidyl of tetraphenolethane; a diglycidyl ether of bisphenol-A; or a diglycidyl ether of bisphenol-F and the like with a phosphorus element-containing compound such as a phosphite, a phosphinic acid, or compounds such as 9,10-dihydro-9-oxa-10-phosphaphenanthrene-10-oxide; 10-(2',5'-dihydroxyphenyl)-9,10-dihydro-9-oxa-10-phosphaphenanthrene-10-oxide; bis(4-hydroxyphenyl) phosphine oxide; tris(2-hydroxyphenyl)phosphine oxide; dimethyl-1-bis(4-hydroxyphenyl)-1-phenylmethylphosphonate; tris(2-hydroxy-4/5-methylphenyl)phosphine oxide; tris(4-hydroxyphenyl)phosphine oxide, bis(2-hydroxyphenyl) phenylphosphine oxide, bis(2-hydroxyphenyl) phenylophosphinate, tris(2-hydroxy-5-methylphenyl) phosphine oxide; amino functional compounds such as bis(4-aminophenyl)phenylphosphate and the like.

Examples of useful epoxy resins comprising hydroxyaryl phosphine oxide flame retardants are also disclosed in U.S. Pat. Nos. 6,733,698; 8,404,161; and 8,865,862, obtained by reaction of, e.g., (2-hydroxy phenyl)phosphine oxides or other similar materials, with glycidyl or polyglycidyl ethers, epihalohydrins etc.

Other examples of resins useful in the present invention include those described in WO 99/00451 and U.S. Pat. No. 5,112,931, such as an epoxy resin which is the reaction product of an epoxy compound containing at least two epoxy groups and a chain extender, for example, an epoxy-polyisocyanate adduct or an epoxy-terminated polyoxazolidone. The isocyanate compounds as chain extenders include for example MDI, TDI etc.

It is generally advantageous to use an epoxy resin which possesses average more than 1 and preferably at least 1.8, more preferably at least 2 epoxy groups per molecule. In many embodiments of the present invention, the epoxy resin (a) is a non-halogenated epoxy resin material.

In many embodiments the composition will comprise a non-halogenated, non-phosphorus element-containing epoxy resin, which has no alkyl aliphatic substituents or has a low amount of alkyl aliphatic substituents, such as for example the glycidyl ether of a phenol novolac, or the glycidyl ether of bisphenol-F, the glycidyl ether of bisphenol-S, bisphenol-A, or dihydroxyl ether of fluorene 9-bisphenyl; or trisepoxy, or dicyclopentadiene modified phenol epoxy resin, or mixtures thereof.

For example, the epoxy resin is an epoxy novolac resin (sometimes referred to as epoxidized novolac resins, a term which is intended to embrace both epoxy phenol novolac resins and epoxy cresol novolac resins), which are readily commercially available. For example, a novolac epoxy resin with at least 2.5 epoxy groups per molecule.

Generally, the epoxy resin (a) is used in an amount of from about 30 wt % to about 95 wt %. More than one epoxy resin may be present in the composition.

Curable epoxy resin formulations comprise a hardener, cross-linker or curing agent. For example, the epoxy resins and can be cured with standard hardeners such as a combination of dicyandiamide and 2-methylimidazole. The terms "hardener", "cross-linker", and "curing agent" are often used interchangeably in the art, and as used herein also encompasses materials or compounds which form a cross linker such as a phenolic cross linker upon heating. Likewise, the term "catalyst" as used in relation to curable epoxy resins is used interchangeably with the term "accelerant".

Materials useful as cross linkers in the present invention include phenolic cross linking agents having a functionality of at least 2 and include compounds, either polymeric or monomeric, having at least 2 phenolic —OH (hydroxyl groups) capable of reacting with epoxy groups. For example, hydroxyaryl hardeners useful in the present invention include, but are not limited to, phenolic resins obtained from the reaction of phenols or alkyl-substituted phenols with formaldehyde, such as phenol novolaks, cresol novolaks, and resoles. Monomeric hydroxyaryl cross-linkers include 3,4,5-trihydroxybenzoic acid (also known as gallic acid) or its derivatives, or pyrogallol (also known as 1,2,3-trihydroxybenzol), or 1,2,4-trihydroxybenzol (also known as hydroxyhydrochinon); 1,8,9-trihydroxyanthracene, 1,2,10-trihydroxyanthracene; 2,4,5-trihydroxypyrimidine; tris(hydroxyphenyl)methane; tetraphenolethane; and the like.

Many cross-linkers are compounds that are also used in the preparation of certain epoxy resins, e.g., the navolaks above and the phosphorus containing compounds useful as cross-linkers, that can be converted into epoxy resins as described in U.S. Pat. Nos. 6,403,220; 6,645,631; 6,733, 698; 8,404,161; and 8,865,862.

Other useful curing agents include amines and compounds derived from amines. Amine hardeners include, but are not limited to, alkyl amines, aryl amines, amides, biguanide derivatives, melamine and guanamine derivatives, imidazoles, polyamides, polyamidoamines, imidazolines, araliphatic amines, polyamines such as polyetheramines, and the like. Examples of amine or amine derived curing agents include dicyandiamide, substituted dicyandiamide, m-phenylenediamine, methylene-dianiline, diaminodiphenylsulfone, ethylenediamine, diethylenetriamine, sulfanilamide, 2,4-diamino-6-phenyl-1,3,5 triazine, bismaleic triazines, cyanate esters such as dicyanate of dicyclopentadienyl bisphenol, dicyanate of bisphenol-A, isocyanates such as MDI, TDI and the like, as found in art, e.g., WO 99/00451.

The epoxy resins may also be cured by the action of combinations involving amines with Lewis acids. Combinations of nitrogen-containing hardeners with Lewis acids include the heterocyclic secondary and tertiary amines and the Lewis acids include oxides and hydroxides of zinc, tin, silicon, aluminum, boron, and iron.

Examples of compounds which form a cross linking agent upon heating include benzoxazine and derivatives of benzoxazine. Examples include benzoxazine of phenolphthalein, benzoxazine of bisphenol-A, benzoxazine of bisphenol-F, benzoxazine of phenol novolac and the like.

Other curing agents include carboxylic acids and anhydrides, amino-formaldehyde resins, and amine-boron complexes. Many types of curing agents that would be useful can be found in any basic epoxy resin text and include, e.g., anhydrides such as a carboxylic acid anhydrides, styrene maleic anhydride copolymers, maleic anhydride adducts of methylcyclopentadiene and the like; carboxylic acids such as salicylic acid, phthalic acid and the like;

In many embodiments the curing agent will comprise a phenolic cross linker, such as a novolak compound or resin, or an amine or amine derivative, such as dicyandiamide, a substituted dicyandiamide, an aromatic diamine or a cyanate ester.

Formulating an epoxy resin with an appropriate amount of curing agent is well within the ability of one skilled in the art. For example, the curing agent may be a hydroxy functional cross linker, such as a novolac resin etc., and the composition comprises from about 50 to about 150% of the stoichiometric amount of hydroxy groups needed to cure the epoxy resin. In some embodiments, the amount of cross-linker is from about 80 to about 125% of the stoichiometric amount of hydroxy groups needed to cure the epoxy resin. In some embodiments the curing agent may be a diamine, a polyamine, a dicyandiamide or a substituted dicyandiamide and the composition comprises from about 50 to about 150%, e.g., from about 80 to about 125%, of the stoichiometric amount of reactive nitrogens groups needed to cure the epoxy resin. The same principals apply for other cross-linking materials, more than one of which may be used.

Combinations of amine catalysts with Lewis acids, especially boron compounds such as $BF_3$, boric acid and derivatives thereof, have long been used in the curing of epoxy resins, and methods for their use are readily found in the art, e.g., U.S. Pat. No. 6,645,631.

In particular embodiments of the invention the epoxy resin compositions are used in the preparation of composite materials and articles such as laminates. A specific example of such an application is in the production of electrical laminates used in printed circuit boards (printed wiring boards, PWB).

As mentioned above, U.S. Pat. Nos. 6,403,220 and 6,645,631 describe process for preparing electrical laminates in which (1) an epoxy-containing formulation is applied to or impregnated into a substrate, which substrate is then (2) heated to draw off solvent in the epoxy formulation and optionally to partially cure the epoxy formulation forming a prepreg, followed by (3) stacking one or more sheets of prepreg in alternating layers with one or more sheets of a conductive material, such as copper foil, and pressed at elevated temperature and pressure for a time sufficient to fully cure the resin and form a laminate. The heating process of step (2) to produce the prepreg is known as "B-staging" and typically occurs at temperatures from about 90° C. to about 210° C. for a time ranging from about 1 minute to about 15 minutes. Other temperatures and times are sometimes used.

A typical requirement for these laminates, and many other applications, is flame resistance and a fire retardancy level of V-0 in the standard "Underwriters Laboratory" test method UL 94. The epoxy resin compositions of the invention can meet these requirements without the use of halogen containing compounds such as tetrabromobisphenol A.

One difficulty encountered in the art in preparing the above laminates is that some curable epoxy compositions have gel times as observed by the stroke cure test, of less, sometimes much less, than 180 seconds, which complicates the production of prepregs in forming the laminates. Gel times greater than 180 seconds, for example 250 seconds, for example 300 seconds or greater are more desirable and are readily obtained using the present invention.

It is found that many of the epoxy resin compositions of the invention are well suited for the production of laminates with stringent requirements for flame retardancy, such as, electrical laminates and the prepregs used in their manufacture, due in large part to the ability of the flame retardants of component b) to provide the necessary flame retardancy without speeding or slowing the cure time of the resin. This allows for one to prepare the prepreg under consistent and controllable processing conditions without the complications of an unexpectedly short working window or an under cured resin. The present flame retardants are also stable under demanding conditions, including high temperatures and exhibit negligible negative impact on the physical properties of the cured resin.

Certain particular embodiments of the invention therefore are to epoxy resin compositions useful in preparing laminates and the laminates thus prepared. Specific embodiments relate to epoxy resin compositions of the invention useful in preparing electrical laminates, the process of preparing the laminates using said epoxy resin compositions, prepregs formed using the epoxy resin compositions, and the electrical laminates produced therefrom, for example, electrical laminates prepared from a fibrous reinforcement and an epoxy-containing matrix resin of the invention, and prepregs comprising e.g., a woven or nonwoven fiber mat, e.g., a substrate comprising glass fibers or paper, a cured, semi-cured, or non-cured epoxy resin composition of the invention.

Other more general embodiments relate to flame retardant epoxy compositions that allow for greater control over the cure time or the gel time of the resin.

Resins, other than epoxy resins, can be used in the production of composites and laminates generally, and in the production of circuit boards and prepregs in a manner analogous to that described above. Many such resins are known in the art, which can be used as part of a blend with epoxy resins or in the absence of epoxy resins. Certain embodiments of the invention therefore provide resin compositions comprising the flame retardant b) and one or more base resins, in the presence of, or in the absence of, the epoxy resins described above; the use of such compositions in the manufacturing of prepreg and laminate materials, e.g., electrical laminates; and the prepregs and laminates so manufactured. These non-epoxy resins are often found in very demanding applications with stringent physical, thermal and electrical requirements; non-limiting examples of such resins include cyanate resins, bismaleimide resins, polyimide resins, phenolic resins, furan resins, xylene formaldehyde resins, ketone formaldehyde resins, urea resins, melamine resins, aniline resins, alkyd resins, unsaturated polyester resins, diallyl phthalate resins, triallyl cyanate resins, triazine resins, polyurethane resins, polyolefin resins, polyphenylene ether resins, benzocyclobutene resins, benzoxazine resins, silicone resins and any combination or mixture thereof.

The concentration of the flame retardant b) in the resin composition is of course dependent on the exact chemical composition of the flame retardant, the epoxy resin and other components found in the final composition. For example, flame retardant b) may be present in a concentration of from about 1 to about 60%, e.g., 1 to 55%, 1 to 50%, 1 to 35%, by weight of the total weight of the final composition, but concentrations higher than 60% are possible. Typically there will be at least 2% of flame retardant b) present, for example 3% or more, 5% or more, 10% or more, 15% or more, 20% or more or 25% or more. In many embodiments, flame retardant b) is present in amounts up to 45%, while in other embodiments, the amount of inventive flame retardant is 40% of the polymer composition or less, e.g., 35% or less, or 30% or less. Obviously, when used in combination with other flame retardants or flame retardant synergists, less of flame retardant b) should be needed.

In many embodiments the composition according to the invention comprises a) the epoxy resin, b) the phosphorus containing flame retardant material obtained by heating one, or more than one of the above described phosphonic acid salt of formula (I), (c) a curing agent and (d) one or more additional flame retardant, synergist, and/or flame retardant adjuvant.

Other flame retardants, synergist or adjuvants may be present in an amount that provides the desired improvement in processing and physical properties of the composition. In some compositions only a small amount of component c) will necessary, e.g., 1%, 2%, 3%, 4% or 5% based on the total weight of the composition, in other embodiments, 10%, 15%, 20%, 25% or more may be employed.

For example, the flame retardant polymer composition of the invention may comprise other flame retardants such as alkyl or aryl phosphine oxide flame retardants, alkyl or aryl phosphate flame retardants, alkyl or aryl phosphonates, alkyl or aryl phosphinates, and salts of alkyl or aryl phosphinic acid, e.g., an aluminum tris(dialkylphosphinate) such as aluminum tris(diethylphosphinate). In some embodiments halogenated flame retardants may also be present, but in most embodiments of the invention, halogenated flame retardants, are excluded.

For example, flame retardant polymer composition of the invention may further comprise one or more materials selected from:

carbon black, graphite, carbon nanotubes, silicones; polyphenylene ether (PPE), phosphine oxides and polyphosphine oxides, e.g., benzylic phosphine oxides, poly benzylic phosphine oxides and the like;

melamine, melamine salts, melamine derivatives and condensation, such as, but not limited to, melam, melem, melon, melamine cyanurate, melamine borate, melamine phosphates, melamine metal phosphates, and the like;

inorganic compounds including clays, metal salts such as hydroxides, oxides, oxide hydrates, borates, carbonates, sulfates, phosphates, phosphites, hypophosphites, phosphinites, silicates, mixed metal salts, etc., e.g., talc and other magnesium silicates, calcium silicate, aluminosilicate, aluminosilicate as hollow tubes (DRAGONITE), calcium carbonate, magnesium carbonate, barium sulfate, calcium sulfate, HALLOYSITE or boron phosphate, calcium molybdate, exfoliated vermiculite, zinc stannate, zinc hydroxystannate, zinc sulfide and zinc borate, zinc molybdate (KEMGARD 911A/B), zinc phosphate (KEMGARD 981), magnesium oxide or hydroxide, aluminum oxide, aluminum oxide hydroxide (Boehmite), aluminum trihydrate, silica, tin oxide, antimony oxide (III and V) and oxide hydrate, titanium oxide, and zinc oxide or oxide hydrate, zirconium oxide and/or zirconium hydroxide and the like.

Unless otherwise specified, in the context of the present application, the term "phosphate" when used as a component in a "phosphate salt", such as in metal phosphate, melamine phosphate, melamine metal phosphate, etc., refers to a phosphate, hydrogen phosphate, dihydrogen phosphate, pyrophosphate, polyphosphate, or a phosphoric acid condensation products anion or polyanion.

Likewise, unless otherwise specified, in the context of the present application, the term "phosphite" when used as a component in a "phosphite salt", such as in metal phosphite, etc., refers to a phosphite or hydrogen phosphite.

In some particular embodiments the flame retardant polymer composition comprises one or more synergists or flame retardant adjuvants, e.g., melamine, melamine salts, melam, phosphine oxides and polyphosphine oxides, metal salts such as hydroxides, oxides, oxide hydrates, borates, phosphates, phosphites, silicates and the like, e.g. aluminum hydrogen phosphite, a melamine metal phosphate, e.g., a melamine metal phosphate wherein the metal comprises aluminum, magnesium or zinc. In particular embodiments the one or more additional flame retardant, synergist or flame retardant adjuvant comprises an aluminum tris(dialkylphosphinate) such as aluminum tris(diethylphosphinate), aluminum hydrogen phosphite, methylene-diphenylphosphine oxide-substituted polyaryl ether, xylylenebis(diphenylphosphine oxide), 4,4'-bis(diphenylphosphinylmethyl)-1, 1'-biphenyl, ethylene bis-1,2-bis-(9,10-dihydro-9-oxy-10-phosphaphenanthrene-10-oxide)ethane, melem, or dimelamine zinc pyrophosphate.

When present, an additional flame retardant, synergist or adjuvant d) is present in a range of 100:1 to 1:100 by weight of flame retardant b) to the total weight of additional flame retardant, synergist and adjuvant. Depending on the additional flame retardant, synergist or adjuvant, excellent results can be obtained using a range of 10:1 to 1:10 by weight of flame retardant b) to additional flame retardant, synergist and/or adjuvant, for example, weight ratios ranging from 7:1 to 1:7, 6:1 to 1:6, 4:1 to 1:4, 3:1 to 1:3 and 2:1 to 1:2 are used to good benefit.

The flame retardant epoxy resin composition of the invention will also typically contain one or more of the common stabilizers or other additives frequently encountered in the art including stabilizers, fillers, reinforcing agents, emulsifiers, pigments, dyes, optical brighteners, anti-static agents, anti-drip agents, etc., e.g., materials such as PTFE, ultraviolet light absorbers, hydrotalcites, metal oxides, borates, alkali metal salts and alkaline earth metal salts and the like.

Fillers and reinforcing agents that may be present, include, e.g., glass fiber, glass fabrics, glass matt, milled glass fiber, glass beads (solid or hollow), metal compounds and clays such as calcium carbonate, silicates, glass fibers, talc, kaolin, bentonite, mica, barium sulfate, metal oxides and hydroxides, carbon black, graphite, wollastonite, silica, silicon carbide whiskers and so forth. Many of these materials are described in standard industry texts such as the Encyclopedia of Materials Science and Engineering, Vol. #3, pp. 1745-1759, MIT Press, Cambridge, Mass. (1986). Combinations of fillers may be used in some embodiments.

Such fillers and reinforcing agents may often be present at relatively high concentrations, including formulations where the filler or reinforcement is present in concentrations of over 50 wt % based on the weight of the final composition. More typically, fillers and reinforcing agents are present from about 5 to about 50 wt %, e.g., about 10 to about 40 wt % or about 15 to about 30 wt % based on the weight of the total polymer composition. In prepregs and laminates for printed wiring boards, reinforcing agents such as glass fabric, may be the substrate to which the composition is applied and in some embodiments, the reinforcing agent makes up most of the final composite.

The epoxy compositions are prepared by combining the components according to techniques well-known to one familiar with the art. Inert solvents may be used in preparing the compositions and may be present in the composition when it is applied to a substrate, or introduced into a mold. Curing is accomplished in a common manner, e.g., by heating the composition. In some embodiments, a curing catalyst is present in the composition during cure.

EXAMPLES

Flame retardant resin compositions can be prepared using methods known in the art or variations thereof and used in the preparation of prepregs and laminates in a manner generally analogous to procedures known in the art, e.g., U.S. Pat. Nos. 6,403,220 and 6,645,631.

General Example

An epoxy resin based formulation containing one or more epoxy resins, a catalyst, and a curing agent, such as a novolac resin or an amine-based curing agent, can be mixed according to known methods with a flame-retarding level of a flame retardant from US 20150031805, i.e., copending U.S. patent application Ser. No. 14/337,500, e.g., the flame retardant from Example 1 from US 20150031805, prepared by thermal treatment of methylphosphonic acid aluminum salt, to make a resin varnish. The varnish is then coated onto glass fabric and B-staged in an oven to generate prepregs, which are then stacked 8-ply and pressed at elevated pressure and temperature to form a uniform laminate capable of obtaining a flammability rating of V-0 per the UL-94 test.

Flame Retardant from Methylphosphonic Acid Aluminum Salt

A solution of methylphosphonic acid in deionized water is added aluminum ethoxide under nitrogen, stirred for 16 h, concentrated and dried at 100 C in vacuo providing a clear, colorless solid that was heated for 4 h at 280° C. according to the process of Example 1 from US 20150031805 to yield the flame retardant.

FR Test Results from Laminates 1 and 2

An epoxy resin stock solution prepared from a 1:1 w/w mixture of DEN-438 and EPOXYHARZ C in acetone was mixed in appropriate ratio with a novolac resin stock solution prepared from SD-1708 in a similar manner. 2-methylimidazole (2MI) was added and dissolved. To this mixture was added the Flame Retardant from Methylphosphonic Acid Aluminum Salt above to make the final formulation varnish. Amounts of each component are shown in Table 1 below.

TABLE 1

| Material | Laminate 1 | Laminate 2 |
|---|---|---|
| DEN-438 (g) | 70.0 | 65.0 |
| EPOXYDHARZ C (g) | 70.0 | 65.0 |
| SD-1708 (g) | 77.2 | 71.6 |
| Flame Retardant (g) | 54.3 | 86.4 |
| 2-MI (g) | 0.19 | 0.245 |

The varnish mixture was vigorously shaken in a bottle and the viscosity was adjusted as needed with acetone. The varnish was coated onto eight plies of 7628 glass fabric and B-staged at 170° C. The resulting prepregs were stacked 8-ply and pressed at 195° C. to give a laminate board. The laminate was cut into test specimens and tested according to UL-94 flammability test protocol. Results are shown in Table 2 below.

TABLE 2

| UL-94 Test | Laminate 1 | Laminate 2 |
|---|---|---|
| Bar 1 (T1/T2), sec | 1, 9 | 0, 6 |
| Bar 2 (T1/T2), sec | 0, 0 | 0, 7 |
| Bar 3 (T1/T2), sec | 1, 8 | 0, 8 |
| Bar 4 (T1/T2), sec | 0, 13 | 0, 6 |
| Bar 5 (T1/T2), sec | 0, 11 | 0, 2 |
| Total burn time, sec | 43 | 29 |
| Rating | V-1 | V-0 |

Excellent flammability performance is observed, achieving V-0 performance for Laminate 2 and nearly V-0 performance for Laminate 1.

What is claimed:

1. A process for preparing electrical laminates comprising:
   formulating a flame retardant resin composition comprising:
   a) a cyanate resin, bismaleimide resin, polyimide resin, phenolic resin, furan resin, xylene formaldehyde resin, ketone formaldehyde resin, urea resin, melamine resin, aniline resin, alkyd resin, unsaturated polyester resin, diallyl phthalate resin, triallyl cyanate resin, triazine resin, polyurethane resin, polyolefin resin, polyphenylene ether resin, benzocyclobutene resin, benzoxazine resin or silicone resin,
   b) from 1% to 60%, by weight based on the total weight of the flame retardant resin composition, of a flame retardant material obtained by a process comprising heating at temperatures of about 200° C. or higher from about 0.01 hour to about 20 hours one or more than one compound of formula (I)

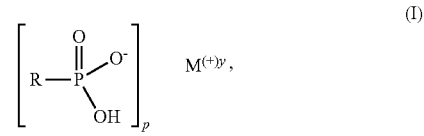

wherein
   R is $C_{1-12}$ alkyl, $C_{6-10}$ aryl, $C_{7-18}$ alkylaryl, or $C_{7-18}$ arylalkyl, wherein said alkyl, aryl, alkylaryl, or arylalkyl are unsubstituted or are substituted by halogen, hydroxyl, amino, $C_{1-4}$ alkylamino, di-$C_{1-4}$ alkylamino, $C_{1-4}$ alkoxy, carboxy or $C_{2-5}$ alkoxycarbonyl;
   M is a metal,
   y is a number of from 1 to 4 so that $M^{(+)y}$ is a metal cation where (+)y represents the charge formally assigned to the cation, and p is a number of from 1 to 4, and
   c) a curing agent;
   applying to, or impregnating into a substrate said flame retardant resin composition to obtain a resin coated substrate,
   heating the resin coated substrate at a temperature sufficient to draw off solvent from the flame retardant resin composition and optionally to partially cure the flame retardant resin composition to form a prepreg, followed by stacking sheets of prepreg or layering sheets of prepreg, in alternating layers, with one or more sheets of a conductive material followed by processing to provide fully processed laminates.

2. The process according to claim 1 wherein the flame retardant material (b) is obtained by a process comprising:
i) preparing an intermediate salt complex by treating one or more phosphonic acid compound with one or more appropriate metal compound to give an intermediate salt complex corresponding to formula (I) comprising multiple values for R and/or M, and then heating the intermediate salt complex at temperatures of about 200° C. or higher for about 0.01 hour to about 20 hours;
or
ii) preparing an intimate salt mixture by combining two or more individual metal phosphonic acid salts of formula (I) which have differing values for R and/or M, and then heating the intimate salt mixture at temperatures of about 200° C. or higher for about 0.01 hour to about 20 hours;
or
(iii) heating at temperatures of about 200° C. or higher for about 0.01 hour to about 20 hours two or more separate metal phosphonic acid salts of formula (I), which differ by having different values for R and/or M to form individual flame retardant materials that are subsequently mixed together to form a blended flame retardant material.

3. The process according to claim 1 wherein M in formula (I) is Li, K, Na, Mg, Ca, Ba, Zn, Zr, B, Al, Si, Ti, Sn or Sb.

4. The process according to claim 1 wherein M in formula (I) is Al or Ca.

5. The process according to claim 1 wherein in formula (I) R is unsubstituted $C_{1-6}$ alkyl, $C_6$ aryl, $C_{7-10}$ alkylaryl, or $C_{7-12}$ arylalkyl.

6. The process according to claim 1 wherein the flame retardant resin composition further comprises d) one or more compounds selected from the group consisting of additional flame retardants, one or more synergists and flame retardant adjuvants.

7. The process according to claim 1 wherein the curing agent comprises a phenolic cross linker, a diamine, a polyamine, a dicyandiamide or a substituted dicyandiamide.

8. The process according to claim 1 wherein the flame retardant resin composition further comprises one or more epoxy resin.

9. The process according to claim 8 wherein the epoxy resin comprises an epoxy novolac resin.

10. An electrical laminate obtained according to the process according to claim 1.

11. A process for preparing a prepreg useful in manufacturing a laminate comprising:
formulating a flame retardant resin composition comprising:
a) a cyanate resin, bismaleimide resin, polyimide resin, phenolic resin, furan resin, xylene formaldehyde resin, ketone formaldehyde resin, urea resin, melamine resin, aniline resin, alkyd resin, unsaturated polyester resin, diallyl phthalate resin, triallyl cyanate resin, triazine resin, polyurethane resin, polyolefin resin, polyphenylene ether resin, benzocyclobutene resin, benzoxazine resin or silicone resin,
b) from 1% to 60%, by weight based on the total weight of the flame retardant resin composition, of a flame retardant material obtained by a process comprising heating at temperatures of about 200° C. or higher from about 0.01 hour to about 20 hours one or more than one compound of formula (I)

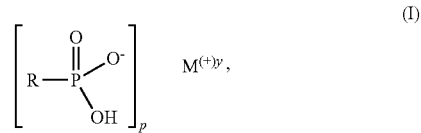

wherein
R is $C_{1-12}$ alkyl, $C_{6-10}$ aryl, $C_{7-18}$ alkylaryl, or $C_{7-18}$ arylalkyl, wherein said alkyl, aryl, alkylaryl, or arylalkyl are unsubstituted or are substituted by halogen, hydroxyl, amino, $C_{1-4}$ alkylamino, di-$C_{1-4}$ alkylamino, $C_{1-4}$ alkoxy, carboxy or $C_{2-5}$ alkoxycarbonyl;
M is a metal,
y is a number of from 1 to 4 so that $M^{(+)y}$ is a metal cation where (+)y represents the charge formally assigned to the cation, and p is a number of from 1 to 4, and
c) a curing agent;
applying to, or impregnating into a substrate said flame retardant resin composition to obtain an resin coated substrate,
heating the resin coated substrate at a temperature sufficient to draw off solvent from the flame retardant resin composition and optionally to partially cure the flame retardant resin composition to form a prepreg.

12. The process according to claim 11 wherein the flame retardant material (b) is obtained by a process comprising:
i) preparing an intermediate salt complex by treating one or more phosphonic acid compound with one or more appropriate metal compound to give an intermediate salt complex corresponding to formula (I) comprising multiple values for R and/or M, and then heating the intermediate salt complex at temperatures of about 200° C. or higher for about 0.01 hour to about 20 hours;
or
ii) preparing an intimate salt mixture by combining two or more individual metal phosphonic acid salts of formula (I) which have differing values for R and/or M, and then heating the intimate salt mixture at temperatures of about 200° C. or higher for about 0.01 hour to about 20 hours;
or
(iii) heating at temperatures of about 200° C. or higher for about 0.01 hour to about 20 hours two or more separate metal phosphonic acid salts of formula (I), which differ by having different values for R and/or M to form individual flame retardant materials that are subsequently mixed together to form a blended flame retardant material.

13. The process according to claim 11 wherein M in formula (I) is Li, K, Na, Mg, Ca, Ba, Zn, Zr, B, Al, Si, Ti, Sn or Sb.

14. The process according to claim 11 wherein M in formula (I) is Al or Ca.

15. The process according to claim 11 wherein in formula (I) R is unsubstituted $C_{1-6}$ alkyl, $C_6$ aryl, $C_{7-10}$ alkylaryl, or $C_{7-12}$ arylalkyl.

16. The process according to claim 11 wherein the flame retardant resin composition further comprises d) one or more compounds selected from the group consisting of additional flame retardants, one or more synergists and flame retardant adjuvants.

17. The process according to claim 11 wherein the curing agent comprises a phenolic cross linker, a diamine, a polyamine, a dicyandiamide or a substituted dicyandiamide.

18. The process according to claim 11 wherein the flame retardant resin composition further comprises one or more epoxy resin.

19. The process according to claim 18 wherein the epoxy resin comprises an epoxy novolac resin.

20. A prepreg obtain according to the process according to claim 11.

* * * * *